United States Patent [19]

Chaki

[11] Patent Number: 4,532,817
[45] Date of Patent: Aug. 6, 1985

[54] TUNING SHAFT OF PUSHBUTTON TUNER

[75] Inventor: Takao Chaki, Tokyo, Japan

[73] Assignee: Clarion Co., Ltd., Tokyo, Japan

[21] Appl. No.: 438,438

[22] Filed: Nov. 2, 1982

[30] Foreign Application Priority Data

Nov. 6, 1981 [JP] Japan .................. 56-164912[U]

[51] Int. Cl.³ .................. F16H 35/18; G05G 1/10; F16D 11/04; H03J 5/06
[52] U.S. Cl. .................. 74/10.33; 74/553; 74/554; 74/483 PB; 192/67 R; 192/95; 334/7
[58] Field of Search ............ 74/10.85, 10.33, 483 PB, 74/553, 554; 334/7; 192/67 R, 95

[56] References Cited

U.S. PATENT DOCUMENTS

| 2,251,476 | 8/1941 | Winchell | 74/10.33 |
| 2,780,333 | 2/1957 | Reiser et al. | 192/95 X |
| 3,210,040 | 10/1965 | Thurlow | 192/67 R X |
| 3,329,452 | 7/1967 | Ammon | 74/553 X |
| 3,986,409 | 10/1976 | Tripp et al. | 74/554 X |
| 4,036,079 | 7/1977 | Pratt | 74/554 X |
| 4,201,096 | 5/1980 | Morrison et al. | 74/554 X |

Primary Examiner—Allan D. Herrmann
Assistant Examiner—Stephen B. Andrews
Attorney, Agent, or Firm—Flynn, Thiel, Boutell & Tanis

[57] ABSTRACT

A tuning shaft for use in switch type pushbutton tuners wherein a clutch shaft portion configured in a regular polygon in its section is formed integrally with the tuning shaft portion as extending from the front end of the tuning shaft portion.

2 Claims, 10 Drawing Figures

TUNING SHAFT OF PUSHBUTTON TUNER

BACKGROUND OF THE INVENTION

1. Field of the Invention

This invention relates to a so-called switch-type pushbutton tuner, and is particularly directed to construction of tuning shafts connected to individual pushbuttons.

2. Description of the Prior Art

Pushbutton tuners, in general, are used to tune a radio receiver, etc. at a broadcasting station by inserting a core movable simultaneously with a pushbutton in a coil. There is a so-called switch type pushbutton tuner as being one of said pushbutton tuners. This switch type pushbutton tuner is to effect tuning by pushing a desired one of several pushbuttons which outwardly protrude through a front face of the tuner. Each pushbutton has a tuning shaft integrally connected thereto so that when the pushbutton is rotated, the tuning shaft also rotates, thereby presetting a frequency to a pushbutton.

Such switch type pushbutton tuner, however, some time causes deviation of a frequency which is preset to a pushbutton due to careless rotation of the pushbutton upon pushing operation thereof because the tuning shaft is integrally connected to the pushbutton.

In this connection, there has been proposed a pushbutton tuner having clutch mechanism between a pushbutton and a tuning shaft so as not to rotate the tuning shaft even if the pushbutton is rotated except upon presetting a frequency, thereby preventing preset frequency deviation. Namely, a tuning shaft 1, as shown in FIG. 1, has at a front end (right end in the Figure) thereof a clutch shaft 2 configured in substantially elongated rectangular-shaped section. A pushbutton 3 to be engaged with the clutch shaft 2 has a clutch cavity 4 in a configuration corresponding to that of the section of the clutch shaft. When the clutch shaft 2 is inserted in the clutch cavity 4 and the clutch shaft 1 is integrally connected to the pushbutton 3, rotation of the pushbutton 3 is transmitted to the tuning shaft 1, so that an associated core enters in a coil to a depth corresponding to moving amount of a core slide which is urged by a screw member mounted on the tuning shaft 1, thereby selecting a desired frequency.

Upon tuning operation of a radio, in order to make the clutch shaft 2 at the front end of the tuning shaft 1 engage with the clutch cavity 4, length direction of the rectangles of the clutch shaft 2 and the clutch cavity 4 must coincide. To this end, it has been necessary to rotate the pushbutton about 180 degrees at maximum after pushing the same. This prevents prompt tuning operation because it is difficult to rotate the pushbutton 3 so large angle as 180 degrees by one hand.

OBJECT OF THE INVENTION

This invention has been made to meet a requirement to effect engagement between a pushbutton and a clutch with only a small rotation angle. To this end, a tuning shaft is integrally formed by molding plastic resin and has a clutch shaft which is integrally formed at the front end thereof near the pushbutton and improved in its configuration, thereby permitting smooth connection of the tuning shaft with the pushbutton and leading to facility of manufacture of the tuning shaft.

SUMMARY OF THE INVENTION

In accordance with the present invention, there is provided a tuning shaft for use in switch-type pushbutton tuners which comprises:
tuning shaft portion;
clutch shaft portion engageable with a pushbutton of said pushbutton tuner; and
said tuning shaft portion and said clutch shaft portion being formed in one single body, and said clutch shaft portion being configured in a regular polygon in its section.

DETAILED DESCRIPTION OF THE PREFERRED EMBODIMENT

Figure 1:
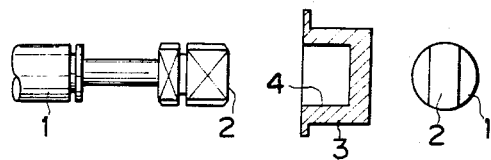
FIG. 1 is a front elevation and a side elevation showing configuration of a front part of a tuning shaft in the prior art.
Figure 2:
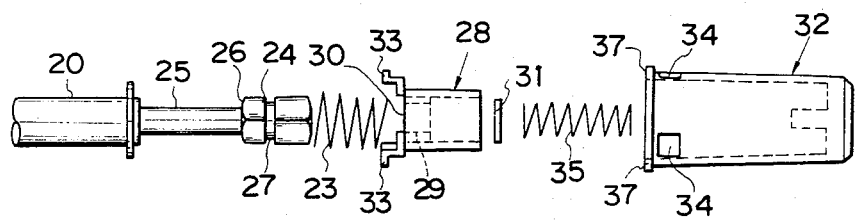
FIG. 2 is a side elevation of a pushbutton tuner incorporating the tuning shaft according to the present invention with parts being disassembled.
Figure 3:
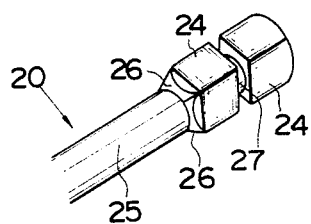
FIG. 3 is an enlarged perspective view of a part around the clutch shaft of FIG. 2.
Figure 4:
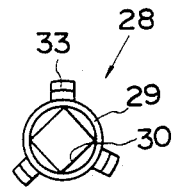
FIG. 4 is a front elevation of the sub-button for engagement with the clutch shaft.

The present invention will now be described in detail by way of an embodiment referring to FIGS. 2 to 6.

The reference numeral 20 designates a tuning shaft portion made of a plastic resin or a die casting, 21 is a front panel and 22 is a decorative cover provided in front of the front panel 21. Between the front end of the tuning shaft portion 20 and the front panel 21 is provided a spring 23 so as to urge the tuning shaft portion 20 frontward of the pushbutton tuner.

A clutch shaft portion 24 is integrally formed with the tuning portion 20 frontward of the pushbutton tuner through a neck 25. The clutch shaft portion 24 is configured in regular-polygonal section. The neck 25 has a diameter smaller than that of the clutch shaft portion 24. The rear end of the clutch shaft portion 24 is dully sloping down (shown by 26) to the neck 25 and each edge between the taper face 26 and the axially straight face is chamfered to form a circular arc. The clutch shaft portion 24 has an annular groove 27 at a middle portion thereof to mount a C ring therein.

The clutch shaft portion 24 and a part of the neck adjacent to the clutch shaft portion 24 are covered by a sub-button 28 which is hollow member having a recess 29 substantially covering one end thereof opposed to the tuning shaft portion 20. A clutch hole 30 configured in a regular-polygon corresponding to the section of the clutch shaft portion 24 is provided in the recess 29. The smallest diameter of the clutch hole 30 is slightly larger than the diameter of the neck 25 of the tuning shaft portion 20. A C ring 31 is inserted in the annular groove 27 after the clutch shaft portion 24 is inserted in the sub-button 28 through the clutch hole 30 so that the C ring may abut the recess 29 to thereby prevent the clutch shaft portion 24 from getting out of the sub-button 28.

A pushbutton 32 is mounted so as to cover the sub-button 28. The pushbutton 32 and the sub-button 28 are coupled to each other by inserting claws, for example, formed along the edge of the sub-button 28 in bores 34 formed along the periphery of the pushbutton 32. A second spring 35 is provided between the front wall of the pushbutton 32 and the front end of the tuning shaft portion 24 which is located in the sub-button 28. Force of the second spring 35 is slightly smaller than that of the first spring 23 which is provided between the front end of the tuning shaft portion and the front panel 21.

The pushbutton 32 is prevented from shifting frontward by a stopper means. Namely, the pushbutton 32 is inserted in a button hole 36 formed in the decorative plate 22 movably in frontward/rearward directions and has a stopper 37 formed at the rear end so that the stopper 37 may abut the back surface of the decorative plate 22.

The pushbutton mechanism incorporating the tuning shaft according to the present invention functions as follows.

Figure 5A:
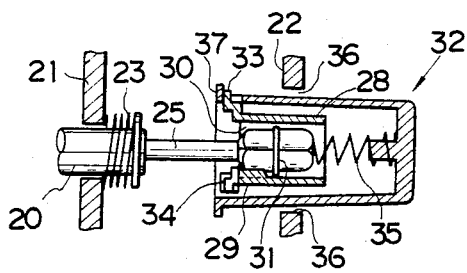
FIGS. 5A and 5B are sectional views of the tuning shaft in assembled state and each is in different operating state.

Upon presetting a frequency to a pushbutton, the pushbutton 32 is pushed to shift the tuning shaft portion 20 coupled for simultaneous movement with the pushbutton 32 deeper in the pushbutton tuner. Then, a neck not shown of the tuning shaft portion 20 engages a lock plate not shown which is mounted pushbutton tuner in the same manner as conventional switch type pushbutton mechanisms, whereby the tuning shaft portion 20 is kept in a deeper position in the pushbutton tuner as shown in FIG. 5A.

In this case, the pushbutton 32 is urged by the second spring 35 and restores forward until the recess 29 of the sub-button 28 abuts the rear end of the clutch shaft portion 24. When the pushbutton 32 is rotated in this position until the regular polygon of the clutch hole 30 angularly meets the regular polygon of the clutch shaft portion 24, the pushbutton 32 comes to further shift forward due to expansion force of the second spring 35, so that the clutch shaft portion 24 engages the clutch hole 30. Revolution amount required for effecting coincidence of the angles of the clutch shaft portion 24 and the clutch hole 30 is only 90 degrees at maximum in this case, which is much smaller than that of the conventional one. Further, the tapered and chamfered rear end of the clutch shaft portion 24 makes it smooth for the clutch shaft portion 24 to enter in the clutch hole 30.

Once the clutch shaft portion 24 having engaged the clutch hole 30, revolution of the pushbutton 32 is transmitted to the tuning shaft portion 20 by way of the sub-button 28, clutch hole 30 and the clutch shaft portion 24. In accordance with rotation of the tuning shaft portion 20, a screw member not shown which is mounted on a threaded portion of the tuning shaft portion 20 but cannot rotate simultaneously with the same due to disturbance by a stopper not shown changes its position on the tuning shaft portion 20. This position of the screw member which has been determined as in the above determines insertion amount of a core not shown in a tuning coil not shown, whereby a given frequency is constantly selected when the pushbutton 32 is pushed, as known in the prior art.

In this case, the pushbutton 32 never thoroughly gets out of the clutch shaft portion 24 because the C ring 31 which is inserted in the annular groove 27 of the clutch shaft portion 24 abuts the inner surface of the recess 29 of the sub-button 28.

Figure 5B:
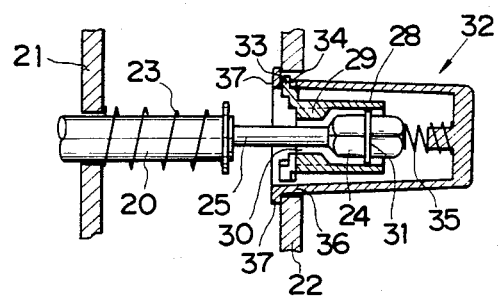
Figure 6A:
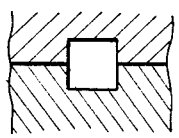
FIGS. 6A to 6D show examples of shapes of metal molds for manufacturing the tuning shaft.
Figure 6B:
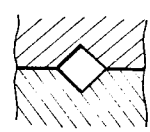
Figure 6C:
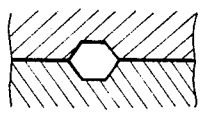
Figure 6D:
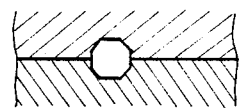

Next, when the tuning shaft portion 20 which was locked within the pushbutton tuner is released, the tuning shaft portion 20 and the pushbutton 32 shift forward of the pushbutton tuner as shown in FIG. 5B. The pushbutton 32 is stopped at the position where the stopper 37 of the pushbutton 32 contacts the back surface of the decorative plate 22 while the tuning shaft portion 20 still continues forward movement due to revival force of the first spring 23. It should be noted that although the second spring 35 gives rearward pressure to the clutch shaft portion 24, the pressure is weaker than forward pressure of the first spring 23. Therefore, the clutch shaft portion 24 moves forward contracting the second spring 35 and gets out of the clutch hole 30 of the sub-button 28. As the result, engagement between the clutch shaft portion 24 and the incorporation of the sub-button 28 and the pushbutton 32 is released so that the pushbutton 32 may rotate freely from the clutch shaft portion 24 and the tuning shaft portion 20. Therefore, even if the pushbutton is carelessly rotated in this state, the tuning shaft portion 20 never rotates, so that tuning deviation due to displacement of the screw member on the tuning shaft 20 can be prevented.

As described in the above, the tuning shaft according to the present invention is so designed that the tuning shaft is operatively linked to the clutch of the pushbutton by rotating the pushbutton to only a small revolution angle because the tuning shaft is configured in a regular polygon. This angle is 120 degrees at maximum when the tuning shaft is equilateral triangle. Therefore, tuning operation can be performed instantly without turning the pushbutton too much. Particularly in this embodiment, the rear end of the clutch shaft portion is sloping down and chamfered, whereby connection of the clutch is performed smoothly. Owing to this, the clutch hole may be formed so that the diameter thereof is not too large with respect to the diameter of the clutch shaft, thereby preventing looseness between the clutch hole and the clutch shaft portion.

The clutch shaft portion may be configured not only in square but also in regular hexagon or regular octagon.

As described in the above, the tuning shaft according to the present invention is connected to the pushbutton mounted at the front end thereof only through the clutch shaft portion and the clutch shaft portion is connected to the pushbutton only upon presetting a frequency by pushing and rotating the pushbutton. In other words, even if the pushbutton is rotated while the tuning shaft is not locked, the rotation is not transmitted to the tuning shaft. Therefore, the present invention prevents undesirable displacement of the screw member due to careless rotation of the tuning shaft and accordingly frequency deviation due to undesirable displacement of the screw member.

Particularly, the regular polygonal section of the clutch shaft portion requires only 120 degrees rotation of the pushbutton, at maximum, when it is equilateral triangular, to effect engagement between the tuning shaft and the pushbutton, thereby leading to reduction of useless rotating operation of the pushbutton and immediate tuning operation.

Further, since the clutch is configured in a regular polygon, it is possible to use split-cavity molds, upper and lower, as shown in FIGS. 6A to 6D upon molding the tuning shaft, which makes it easy to take it out of the molds.

I claim:

1. A tuning shaft for use in switch-type pushbutton tuners which comprises:
a tuning shaft portion;
a clutch shaft portion engageable with a pushbutton of said pushbutton tuner;
said tuning shaft portion and said clutch shaft portion being formed in one single body, said clutch shaft portion being configured in a regular polygon in its section, wherein one end of said clutch shaft portion nearer to the tuning shaft portion includes an axially straight surface and a sloping surface dully sloping down therefrom toward the periphery of the tuning shaft portion, and the boundary between each sloping surface and each associated axially straight surface of the clutch shaft portion is chamfered to form an arc.

2. A tuning shaft for use in switch-type pushbutton tuners which comprises:
a tuning shaft portion;
a clutch shaft portion engageable with a pushbutton of said pushbutton tuner;
said tuning shaft portion and said clutch shaft portion being formed in one single body, said clutch shaft portion being configured in a regular polygon in its section, said single body of the tuning shaft portion and the clutch shaft portion being a molded product, wherein one end of said clutch shaft portion nearer to the tuning shaft portion includes an axially straight surface and a sloping surface dully sloping down therefrom toward the periphery of the tuning shaft portion, and the boundary between each sloping surface and each associated axially straight surface of the clutch shaft portion is chamfered to form an arc.

* * * * *